United States Patent
Chiu

(10) Patent No.: US 6,639,852 B2
(45) Date of Patent: Oct. 28, 2003

(54) SENSING APPARATUS FOR A ROM MEMORY DEVICE

(75) Inventor: Chih-Kang Chiu, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/041,238

(22) Filed: Jan. 7, 2002

(65) Prior Publication Data

US 2003/0128567 A1 Jul. 10, 2003

(51) Int. Cl.[7] ................................................ G11C 7/00
(52) U.S. Cl. .................. 365/196; 365/207; 365/189.09
(58) Field of Search ........................ 365/94, 104, 196, 365/207, 211, 230.06, 210, 189.07, 189.09

(56) References Cited

U.S. PATENT DOCUMENTS

| | | | | |
|---|---|---|---|---|
| 4,648,074 A | * | 3/1987 | Pollachek ................... 365/184 |
| 5,386,158 A | * | 1/1995 | Wang ..................... 365/185.21 |
| 6,115,285 A | * | 9/2000 | Montanari et al. ..... 365/185.03 |
| 6,205,073 B1 | * | 3/2001 | Naji ............................. 365/209 |
| 6,259,622 B1 | * | 7/2001 | Fried et al. ..................... 365/94 |
| 6,407,589 B1 | * | 6/2002 | Wei et al. ...................... 327/55 |
| 6,445,612 B1 | * | 9/2002 | Naji ............................. 365/158 |

* cited by examiner

*Primary Examiner*—Thong Le
(74) *Attorney, Agent, or Firm*—J. C. Patents

(57) ABSTRACT

An apparatus for reading a ROM device. A ROM memory cell's value is determined by comparing the output current from the circuit with a reference current. The output current from a memory cell is outputted to a current conveyor with a reference current and then inputted to a difference sense amplifier which compares the output current with the reference current and amplifies the difference. If a memory cell is programmed the transistor in the memory cell will draw current away from the current source reducing the output current. This will cause the programmed memory cell current to be of a lesser value than a reference current. If a memory cell has been programmed the transistor will not draw any current and therefore the output current will be a greater value than the reference current. Two extra transistors can be added to adjust the current level on reference bitline.

9 Claims, 3 Drawing Sheets

SENSING APPARATUS FOR A ROM MEMORY DEVICE

FIELD OF THE INVENTION

The present invention relates to a sensing apparatus for a ROM memory device, and more particularly, to a sensing apparatus for a ROM memory device to determine the logical value of a selected ROM memory cell by reading its current output.

BACKGROUND OF INVENTION

Read-only memories or ROMs are used to store non-volatile data in digital devices, and, in particular data storage for microprocessor-based computer systems. As electronic devices become smaller in size, they become more dependent on data storage and the amount of data needed to be stored is increased. ROM devices can include non-programmable ROM's such as mask ROMs, and programmable ROMs such as EPROMs, EEPROMs, or Flash EPROMs.

Typically a ROM is divided into a plurality of memory cells, which are arranged into matrices. Each individual memory cell can be accessed using two signal lines typically referred to as a bitline and a wordline. Programming of the ROM devices as to assign each memory cell a logic value is accomplished by defining the threshold voltage of a field effect transistor structure in the memory cell. When a minimum amount of voltage is applied to the gate of the transistor structure, the transistor turns on and permits a current flow between a source and drain regions. Oppositely if a memory cell is not programmed, a different voltage is applied to the gate of the transistor to remain turned off. A read circuit or circuits are connected to the ROM cell matrix to determine what logical value a memory cell represents.

A typical ROM memory apparatus is shown in FIG. 1a. ROM memory cells are addressed by activating the associated wordline and column select line in a memory cell. A voltage source is connected to a first end of the bit line. Transistor 11 is programmable with a reference voltage threshold, transistor 12 is an unprogrammed transistor, and transistor 13 is a programmable memory cell. FIG. 1b shows a voltage-time chart corresponding to the voltages on transistors 11, 12, and 13. When unprogrammed transistor 12 is selected, the transistor will remain turned off when its wordline is selected. Therefore a voltage close to VCC will be applied to input A of the voltage sense amplifier. When transistor 13 is selected and programmed, it will turn on when the wordline is at its specified voltage threshold. This will cause the voltage on its bitline to be reduced accordingly when it is applied to input A of the voltage sense amplifier. Transistor 11 has been programmed with a reference threshold level. When the transistor is selected, it will turn on at a specified voltage threshold, and it will change the voltage of the bitline accordingly. When the output voltage is applied to the input B of the voltage sense amplifier, the transistor 11 will change the voltage in the bitline. The voltage sense amplifier has a delay waiting to compare the voltages before a difference on the bit lines develops. After the delay, the voltage sense amplifier will compare the inputted voltage with the reference voltage and amplify the difference according to the logic value of the selected memory cell.

As the circuit size increases, and more high speed designs are implemented, large bit line capacitance and small cell current become significant problems. A long time period is required for a differential voltage to be established for an accurate output. Equivalently, the capacitive load is related to such factors as the condition of the cells around the bit lines, and their geometric configuration. Therefore a reading method that is not affected by bit line capacitance is needed.

SUMMARY OF THE INVENTION

An object of the invention provides a simple read circuit that can perform quick read operations for a ROM device.

Another objective of the invention is to provide a ROM memory cell read circuit that is not affected by bit line capacitance.

In accordance with the foregoing and other objectives, the invention proposes a ROM sensing apparatus comprising a plurality of memory cells and a decoder for selecting one of the memory cells. The ROM sensing apparatus further comprises a current conveyor having a first end for receiving a current from the selected memory cell and a second end for receiving a reference current, and a current differential sense amplifier coupling to the current conveyor. The current differential sense amplifier is for comparing the current from the selected memory cell and the reference current and amplifying the difference between the two currents.

In accordance with the foregoing and other objectives, the invention proposes an apparatus for sensing a ROM memory device, in which the ROM memory device having a plurality of memory cells and having a plurality of decoders for selecting one of the memory cell. The apparatus comprises a current conveyor having a first end for receiving a current from the selected memory cell and a second end for receiving a reference current, and a current differential sense amplifier coupling to the current conveyor. The current differential sense amplifier is for comparing the current from the selected memory cell and the reference current and amplifying the difference between the two currents.

The invention provides a current source that is connected to one end of a bit line. A ROM memory cell is selected by the word line and column select line. The ROM memory cell can be programmed or not programmed. In the case of a programmed memory cell, when the wordline turns on a transistor in a selected ROM memory cell, a conducting current is passed through the bitline. A current level at the end of the bitline will therefore be equal to the source current subtract the current drawn out by the selected transistor. In the case of a non-programmed memory cell, when the wordline turns on, the selected non-programmed transistor will remain off. Therefore the current level outputted from the bitline will equal the source current. The bitline outputted current level is inputted to a current conveyer according to a reference current, and the current conveyor transfers the current levels to a differential sense amplifier. The sense amplifier compares a memory cell output current with a reference current and determines the logic level of the selected memory cell.

These and other features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

BRIEF DESCRIPTION OF THE DRAWINGS

FIG. 2b is a graph showing the output currents from the ROM memory device of a preferred embodiment of the invention as shown in FIG. 2a.

DETAILED DESCRIPTION

In the following detailed description of the preferred embodiments, reference is made to the accompanying drawings which form a part hereof, and in which is shown by way of illustration specific preferred embodiments in which the invention may be practiced. The preferred embodiments are described in sufficient detail to enable these skilled in the art to practice the invention, and it is to be understood that other embodiments may be utilized and that logical, changes may be made without departing from the spirit and scope of the present invention. The following detailed description is, therefore, not to be taken in a limiting sense, and the scope of the present invention is defined only be the appended claims.

Figure 1A:
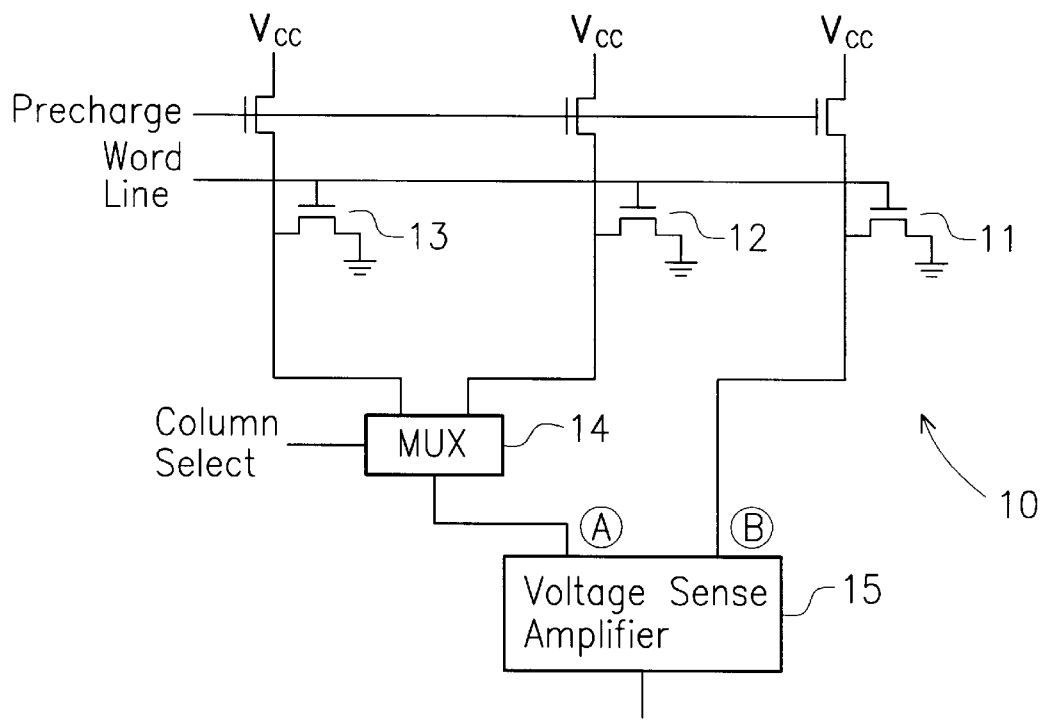
FIG. 1a is a schematic diagram showing a conventional ROM memory.
Figure 1B:
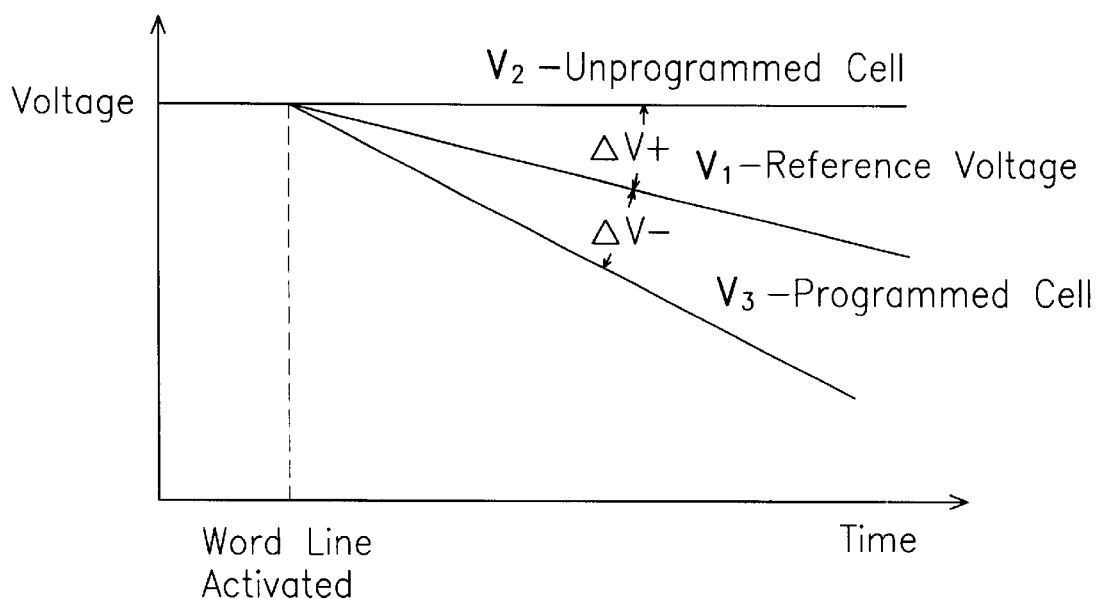
FIG. 1b is a graph showing the output voltages of the conventional ROM memory.
Figure 2A:
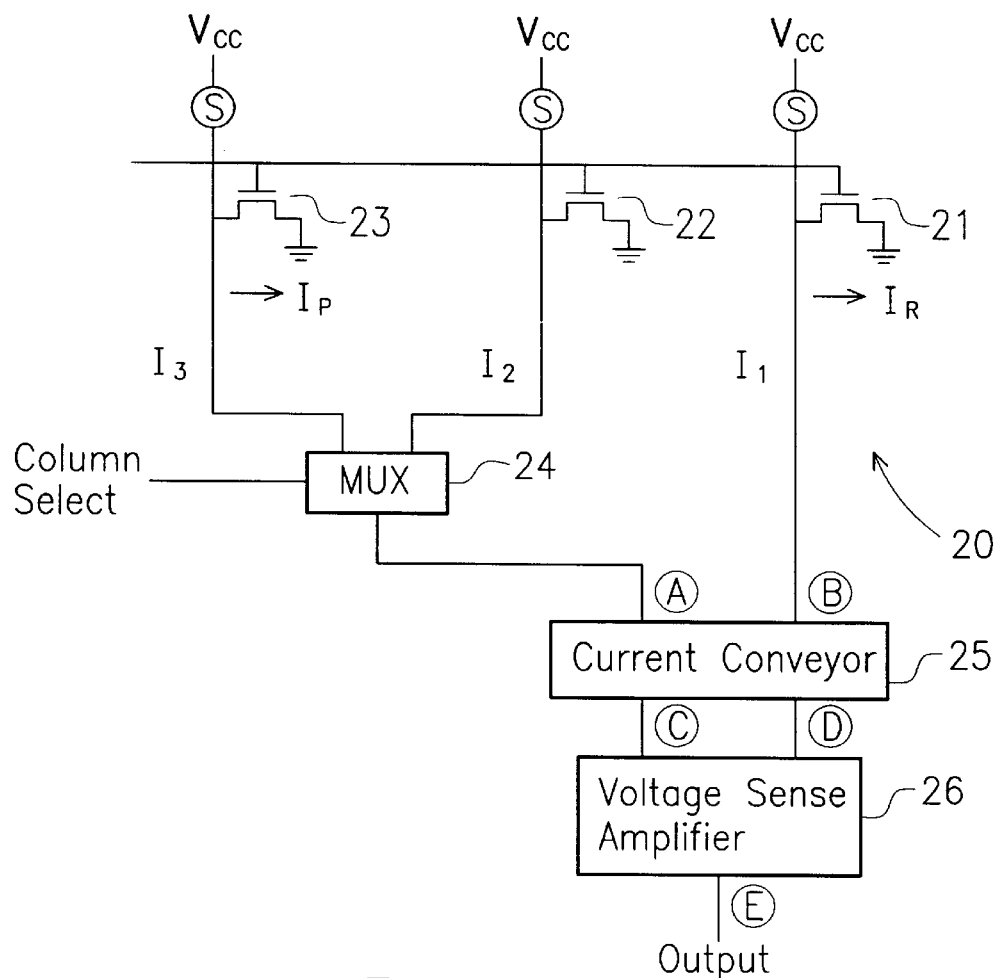
FIG. 2a is a schematic diagram showing a ROM memory device of a preferred embodiment of the invention.

Referring to FIG. 2a, a diagram of a preferred embodiment of the invention is shown. The circuit labeled as 20 is a simple representation of a ROM memory array showing two memory cells, and a reference cell. The memory cells constructed of a simple structure have transistors, although the invention can be applied to a number of different structures and configurations for ROM memory cells. The transistor is programmed by defining the threshold voltage at which the transistor is activated. Transistor 21 is programmable with a reference voltage threshold. Transistor 22 is an unprogrammed memory cell, and transistor 23 is a programmable memory cell. The transistors 22 and 23 are configured having a base connected to a word line, a source connected to a bitline, and a drain connected to system ground. The bitlines connected to transistors 22 and 23 have a first end connected to a current source, and a second end connected to a multiplexer 24 for selecting a desired column depending on a column select signal. Transistor 21 is connected having a base connected to a wordline, a source connected to a reference bitline, and a drain connected to ground. The reference bit line has a first end connected to a current source, and a second end connected to input B of current conveyor 25. Outputs C and D from the current conveyor 25 are inputted to the differential sense amplifier 26. The differential sense amplifier has an output E, which represents the logical value of the memory cell being read.

The reference current operates such that a current source provides current $I_S$ to a plurality of bitlines. Transistor 21 has a set threshold level. When the wordline to transistor 21 is turned on, the transistor 21 will conduct current $I_R$. Therefore the reference current $I_1$ equals the source current subtract the current drawn through transistor 21 ($I_1=I_S-I_R$), $I_1$ is inputted to input B of the current conveyor 25. Transistor 22 is not programmed with a threshold voltage. When the wordline connected to the base of transistor 22 is turned on, transistor 22 will remain turned off. Transistor 22 is not programmed according to a voltage threshold, therefore the current from the current source $I_S$ equals $I_2$.

When the wordline connected to the base of programmed transistor 23 turns on, transistor 23 will be turned on. Transistor 23 is programmed with a threshold voltage. The threshold voltage is intended to represent a logical level, however the invention also allows a plurality of threshold levels to be used that can represent corresponding logic values. When transistor 23 turns on, it will conduct current $I_P$ through the bitline. Therefore $I_3$ equals the source current subtract the programmed current ($I_3=I_S-I_P$). A multiplexer 24 allows a desired signal to pass to input A of the current conveyor as selected by the column select line. The current conveyor 25 accepts the inputs at A and B and transfers the current levels to the outputs C and D. These output current levels will match that of the input current irrespective of the input voltage level. The inputs of the current conveyor 25 have a virtual zero impedance (assume ideal situation) and the outputs of the current conveyor 25 have a high output impedance. The output current levels from the current conveyor 25 are inputted to the differential sense amplifier 26. The differential sense amplifier 26 compares the input current levels and amplifies the difference.

Figure 2B:
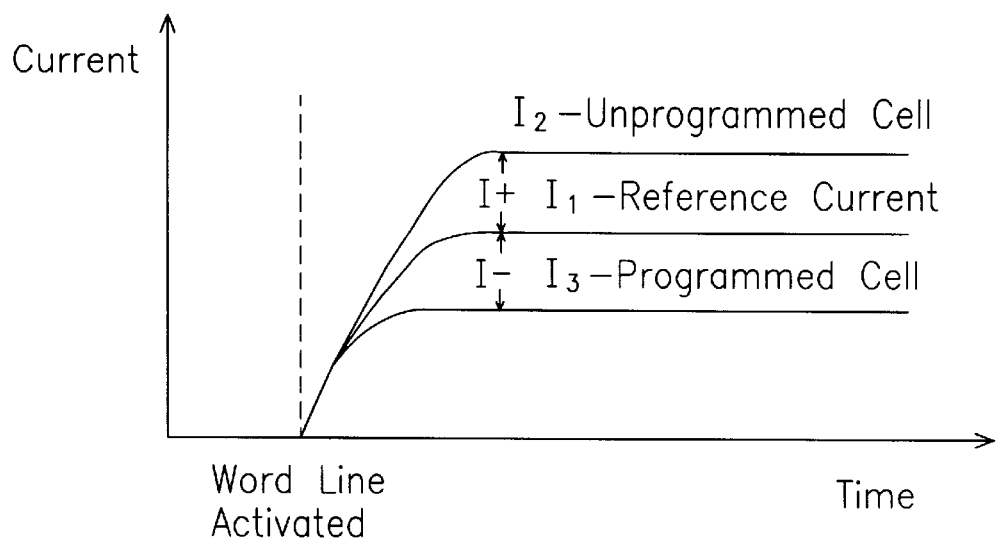

Please refer to FIG. 2b. FIG. 2b is a graph illustrating how the apparatus determines which logical value a cell represents. Initially no current is being drawn. When the wordline and column are selected to activate a particular cell, the current rises to a value dependant upon the setting of the threshold level of the transistor. As seen in FIG. 2b, current $I_2$ rises to the highest level as the current drawn from transistor 22 is negligible. As current $I_2>I_1$ then the circuit amplifies the difference and outputs a signal indicating the cell's logic value. Current $I_3$ rises to the lowest level as transistor 23 draws the largest amount of current. Therefore since $I_1>I_3$ the differential sense amplifier 26 amplifies the difference and outputs a signal indicating the cell's logic value opposite to that indicated by transistor 22. The bit line capacitance will not affect the current flow in the circuit, or prevent a current difference from developing quickly. Therefore the circuit does not need to wait for a difference between the read signal and the reference signal to develop allowing the ROM memory to be read more quickly.

Figure 3:
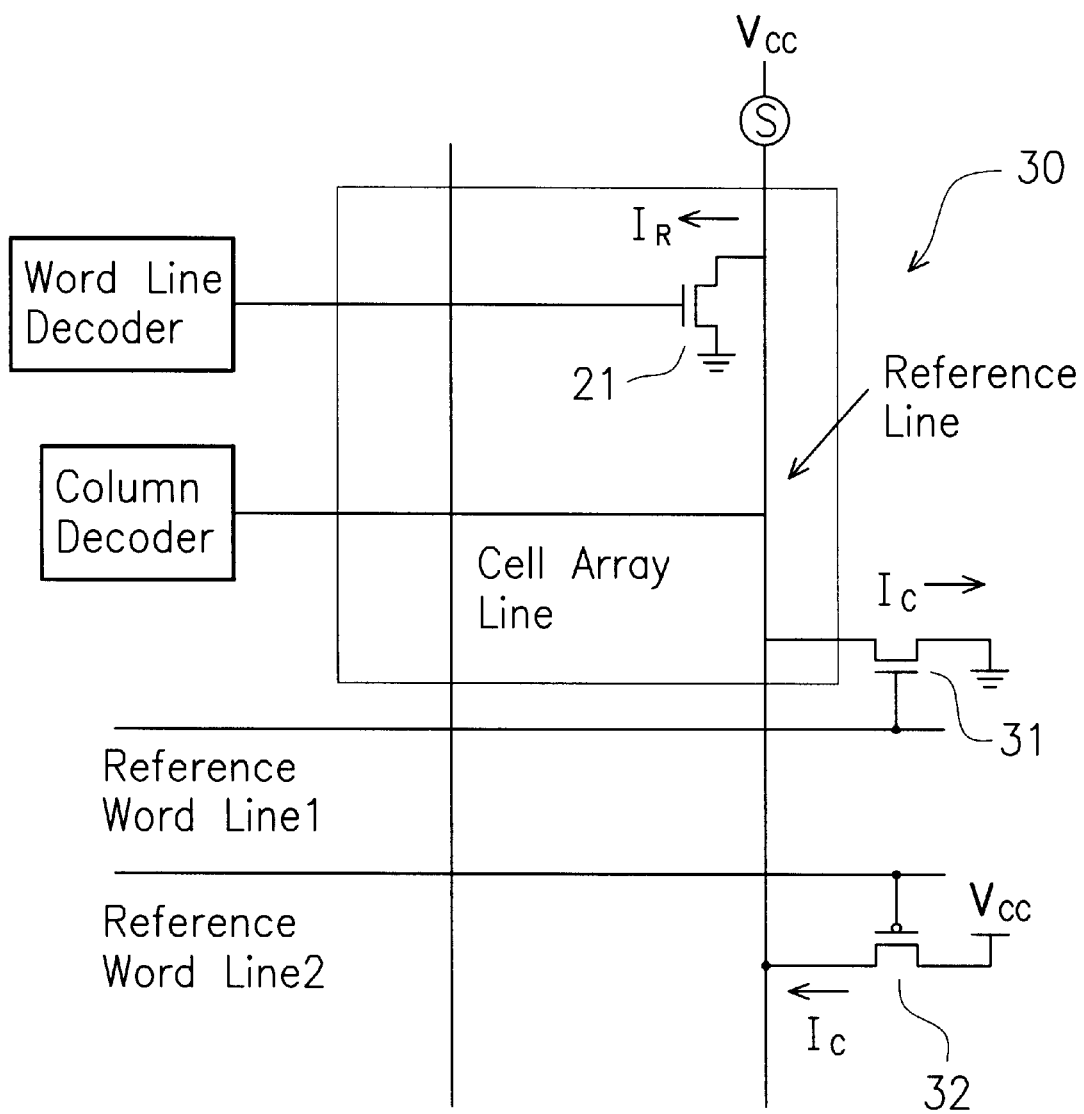
FIG. 3 is a schematic diagram showing a variation of the apparatus according to another embodiment of the invention.

Referring to FIG. 3, in another embodiment of the invention a transistor 31 or transistor 32 are introduced to be connected to a reference bitline of a ROM device 30. The apparatus and operation of the ROM device 30 is the same as in FIG. 2a, however the transistor 31 or transistor 32 are added to the apparatus. The transistor 31 and transistor 32 are used to adjust the current $I_R$. The threshold value of the transistor 31 and transistor 32 can be set at an optimum current level to compensate for manufacturing process differences, device aging, differences in the levels of programmed and unprogrammed current levels and so forth. Transistor 31 has a base connected to an external wordline 1, a source connected to the reference bitline, and a drain connected to ground. Transistor 32 has a base connected to an external wordline 2, a source connected to the reference bitline, and a drain connected to Vcc end. As previously described a current source provides a current level to the bitline. When the wordline connected to the base of transistor 21 turns on, transistor 21 conducts current $I_R$. The transistor 31 for compensation can be further used to reduce the current level on the bitline. If the reference current level does not need compensation, the transistor 31 does not need to be used. When needed, transistor 31 is programmed with a threshold level or the threshold level can be controlled with the reference wordline 1. When the reference wordline turns on, transistor 31 turns on and conducts current $I_C$. Therefore the reference current level $I_R$ equals the source current subtract the reference current and subtract the compensation current ($I_1=I_S-I_R-I_C$). The transistor 32 for compensation can be further used to increase the current level on the bitline. If the reference current level does not need compensation, the transistor 32 does not need to be used. When needed transistor 32 is programmed with a threshold level or the threshold level can be controlled with the reference wordline 2. When the reference wordline turns on, transistor 32 turns on and conducts current $I_C$. Therefore the reference current level $I_1$ equals the source current subtract the reference current and add the compensation current ($I_1 = I_S - I_R + I_C$).

Various additional modifications may be made to the illustrated embodiments without departing from the spirit and scope of the invention. Therefore, the invention lies in the claims hereinafter appended.

What is claimed is:

1. A ROM sensing apparatus comprising:
   a plurality of memory cells;
   a decoder for selecting one of the memory cells through word lines and bit lines, wherein each of the bit lines includes a current source;
   a current conveyor having a first end and a second end, the first end for receiving a current from the selected memory cell, the second end for receiving a reference current; and
   a current differential sense amplifier coupling to the current conveyor, the current differential sense amplifier for comparing the current from the selected memory cell and the reference current and amplifying the difference between the two currents, wherein a threshold level is used to program the memory cells, and a difference of current level due to the threshold level is detected to determine a programmed content of the memory cells.

2. The ROM sensing apparatus of claim 1, wherein the ROM is an EEPROM .

3. The ROM sensing apparatus of claim 1, wherein the ROM is an EPROM.

4. An apparatus for sensing a ROM memory device, the ROM memory having a plurality of memory cells and having a plurality of decoders, the decoders being using for selecting one of the memory cells, the apparatus comprising:
   a plurality of current sources are applied to bit lines in the decoders;
   a current conveyor having a first end and a second end, the first end for receiving a current from the selected memory cell, the second for receiving a reference current; and
   a current differential sense amplifier coupling to the current conveyor, the current differential sense amplifier for comparing the current from the selected memory cell and the reference current and amplifying the difference between the two currents, wherein a threshold level is used to program the memory cells, and a difference of current level due to the threshold level is detected to determine a programmed content of the memory cells.

5. The apparatus of claim 4, further comprising two transistors for compensating the current level from the selected memory cell.

6. The apparatus of claim 5, wherein a threshold voltage of the transistor is set by an external device.

7. The apparatus of claim 5, wherein a threshold voltage of the transistor is set by the decoder.

8. The apparatus of claim 4, wherein the ROM is an EEPROM.

9. The apparatus of claim 4, wherein the ROM is an EPROM.

* * * * *